United States Patent
Chittipeddi et al.

(10) Patent No.: US 6,319,837 B1
(45) Date of Patent: Nov. 20, 2001

(54) TECHNIQUE FOR REDUCING DISHING IN CU-BASED INTERCONNECTS

(75) Inventors: Sailesh Chittipeddi, Allentown, PA (US); Sailesh Mansinh Merchant; Pradip Kumar Roy, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/606,833

(22) Filed: Jun. 29, 2000

(51) Int. Cl.⁷ .................................................. H01L 21/00
(52) U.S. Cl. .............................. 438/692; 216/38; 216/41; 216/88; 438/745
(58) Field of Search ...................................... 438/690, 691, 438/692, 693, 745, 754, 756; 216/38, 41, 88, 89, 91

(56) References Cited

U.S. PATENT DOCUMENTS

| | | | |
|---|---|---|---|
| 5,502,008 | * 3/1996 | Hayakawa et al. | 438/692 X |
| 5,578,523 | * 11/1996 | Fiordalice et al. | 438/692 X |
| 6,083,835 | * 7/2000 | Shue et al. | 438/692 X |
| 6,103,625 | * 8/2000 | Marcyk et al. | 438/692 X |

* cited by examiner

*Primary Examiner*—William A. Powell
(74) *Attorney, Agent, or Firm*—Scott W. McLellan

(57) ABSTRACT

The present invention includes a method for reducing dishing of an integrated circuit interconnect, comprising the steps of providing excess interconnect material above a damascene feature in a substrate and planarizing the substrate and interconnect material to obtain an interconnect in the substrate.

19 Claims, 2 Drawing Sheets

TECHNIQUE FOR REDUCING DISHING IN CU-BASED INTERCONNECTS

FIELD OF THE INVENTION

The invention relates to reducing dishing in metal interconnects, particularly damascene structure interconnects found in integrated circuit wafers.

BACKGROUND OF THE INVENTION

In the manufacture of integrated circuits, interconnects within a level are made by damascene feature called trenches that are filled with an electrically conductive material like metal. Interconnects between levels are made by damascene features called vias. These interconnects are made by first etching a line, in the case of trenches, or a hole, in the case of vias in a substrate. An electrical conductor is then deposited over the entire substrate. The excess conductor is removed by planarizing the substrate with, for example chemical-mechanical polishing.

Ideally, this process produces an interconnect with a top surface that is co-planar with top surface of the substrate. Unfortunately, since chemical mechanical polishing is an abrasive technique, the differing hardnesses of the interconnect material and the substrate material means that they will have different polishing rates. Since the interconnect material, for example aluminum alloy, is softer than the substrate material, for example silicon dioxide or silicon, the interconnect structure will exhibit "dishing," which is a concave shaped surface of the interconnect. This is undesirable for two reasons. Firstly, the cross-sectional area of the interconnect is reduced, which reduces the current carrying capability of the interconnect and increases the sheet resistance. Secondly, the increased radius of curvature where the lip of the dish meets the substrate surface of the substrate increases the local electric field, which worsens electromigration. Dishing has become even more of a concern with the introduction of copper to integrated circuit manufacturing, as copper is softer than the aluminum alloys, such as aluminum silicon copper, which had heretofore been used. Dishing is also exacerbated when interconnects are isolated, because the abrasion rate becomes more uniform as the area of softer material presented for abrasion increases. In other words, widely spaced interconnect lines tend to display reduced copper fill after electroplating and subsequent planarization.

SUMMARY OF THE INVENTION

The present invention includes a method for reducing dishing of an integrated circuit interconnect, comprising the steps of providing excess interconnect material above a damascene structure in a substrate and planarizing the substrate and interconnect material to obtain an interconnect in the substrate.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Dishing of interconnects can be minimized by providing excess interconnect material to be abraded off above the plane of a substrate.

One embodiment of the invention accomplishes this by depositing an electrically conductive interconnect material onto a substrate comprised of a substrate material, and wherein the substrate comprises a damascene feature, planarizing the interconnect material and substrate until an interconnect exhibits dishing, depositing and curing photoresist and planarizing to provide cured resist in the interconnect dish, partially etching the substrate, wherein the etching is selective for the substrate material and planarizing the interconnect material, photoresist and substrate.

Figure 1:
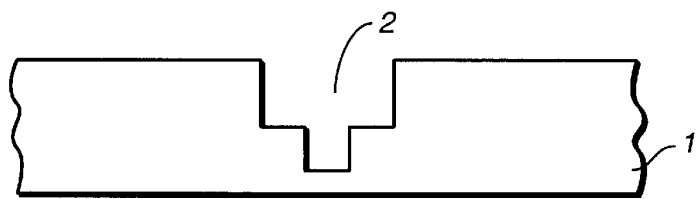
FIG. 1 is a cross-sectional view of a substrate with a dual-damascene feature, in this case a trench, for one embodiment of the invention.
Figure 2:
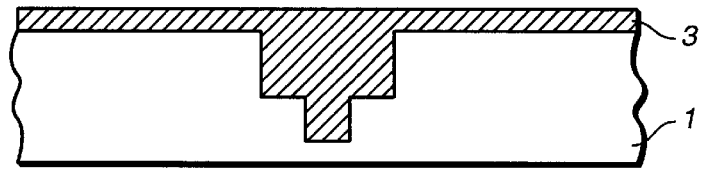
FIG. 2 is a cross-sectional view of the trench and top surface of the substrate after interconnect material deposition, for one embodiment of the invention.
Figure 3:
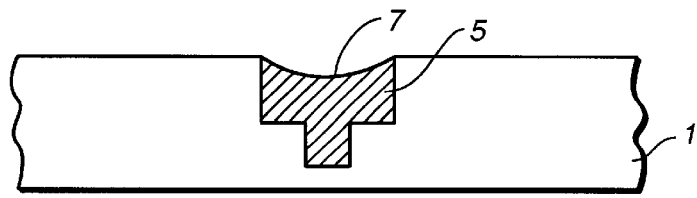
FIG. 3 is a cross-sectional view showing dishing of the top surface of the interconnect formed as a result of chemical-mechanical polishing, for one embodiment of the invention.
Figure 4:
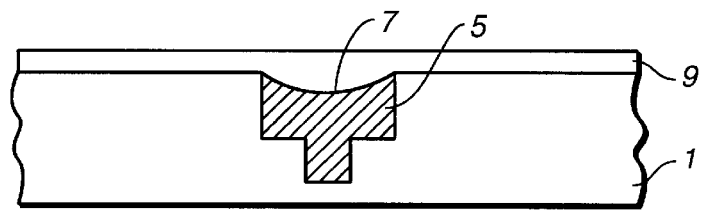
FIG. 4 is a cross-sectional view showing photoresist deposition, for one embodiment of the invention.
Figure 5:
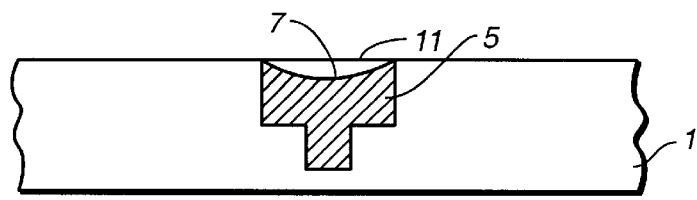
FIG. 5 is a cross-sectional view showing cured photoresist in the dish in the interconnect after chemical mechanical polishing, for one embodiment of the invention.
Figure 6:
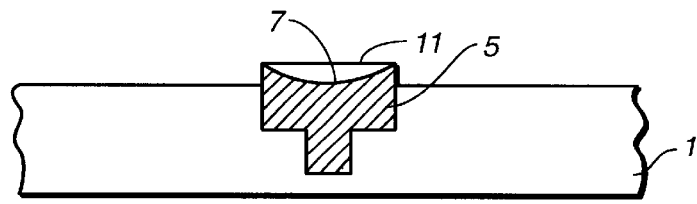
FIG. 6 is a cross-sectional view showing that, after partial substrate etching, the interconnect has excess interconnect material, that is, interconnect material above the plane of the substrate, for one embodiment of the invention.
Figure 7:
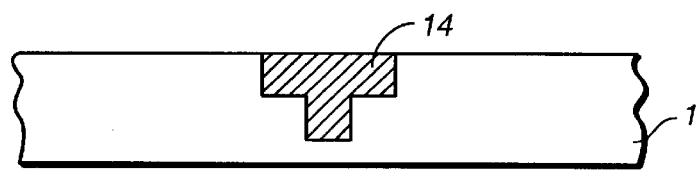
FIG. 7 is a cross-sectional view after planarization, showing an interconnect with minimized dishing, for one embodiment of the invention.

Referring now to the drawing, wherein like reference numerals refer to like elements throughout, FIG. 1 shows a cross-sectional view of a substrate 1 with a dual-damascene feature 2, in this case a trench. Note that the feature could also be a via or single-damascene. By substrate, it is not only meant to include semiconductors like silicon, but also higher level layers of dielectrics, which also contain interconnects, like silicon dioxide, spin-on glass, doped glass, silicon nitride and the like. FIG. 2 shows the trench 2 and top surface of the substrate 1 after interconnect material 3 deposition. The interconnect material will preferably be 1.5 to 2 times thicker than the trench 2 depth in dual-damascene technology. The substrate generally will have higher abrasion resistance than the interconnect material, so the invention has its greatest value with particularly soft materials like copper and copper alloys. However, the invention also has is of value with conventional interconnect materials like aluminum alloys. Also doped polysilicon may be used as an interconnect in a ceramic dielectric like silicon nitride, and also benefit from the invention. FIG. 3 shows dishing of the top surface 7 of the interconnect 5 formed as a result of planarization. While chemical-mechanical polishing is preferred, planarization may also be done with plasma techniques, in which case, it is the plasma resistance rather than the abrasion resistance of the interconnect and substrate materials that is important. FIG. 4 shows a layer of photoresist 9 after deposition and cure. Note that an optional layer of hard mask (not shown) may be deposited prior to depositing the photoresist 9. The photoresist 9 is planarized to provide the structure shown in FIG. 5, which shows cured photoresist 11 in the dished area of the interconnect 5. FIG. 6 shows that, after substrate 1 is partially etched with an etchant selective for the substrate material, the interconnect 5 now has excess interconnect material, that is, interconnect material above the plane of the substrate 1. FIG. 7 shows that after planarization, an interconnect 14 with minimized dishing is provided. Note that the photoresist 11 may be optionally removed prior to planarization (not shown).

While not completely understood, and not wishing to be held to any theory, it may be that the excess amount of interconnect material present (above the plane of the substrate) to be polished away offsets the higher polishing rate (as compared to the substrate) of the interconnect material.

In another embodiment of the invention, an excess of interconnect material above the plane of the substrate may be created by depositing an electrically conductive interconnect material onto a substrate comprised of a substrate material, and wherein the substrate comprises a damascene feature, depositing photoresist and patterning the photoresist to provide cured resist over the damascene feature, etching the interconnect material, wherein the etching is selective for the interconnect material; and planarizing the interconnect material, photoresist and substrate to provide an interconnect in the substrate.

Figure 8:
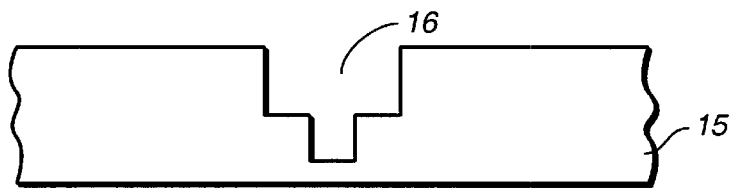
FIG. 8 is a cross-sectional view of a substrate with a dual-damascene feature, in this case a trench, for another embodiment of the invention.
Figure 9:
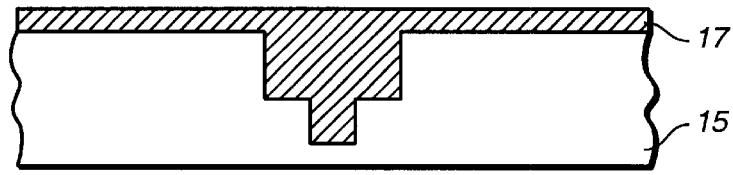
FIG. 9 is a cross-sectional view of the trench and top surface of the substrate after interconnect material deposition, for another embodiment of the invention.
Figure 10:
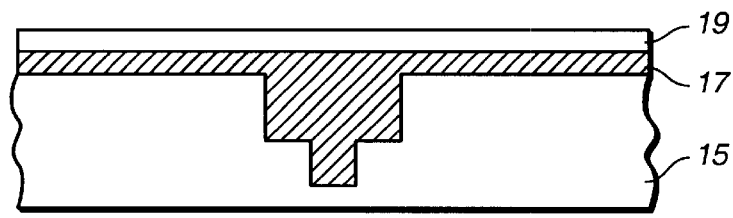
FIG. 10 is a cross-sectional view showing photoresist deposition, for another embodiment of the invention.
Figure 11:
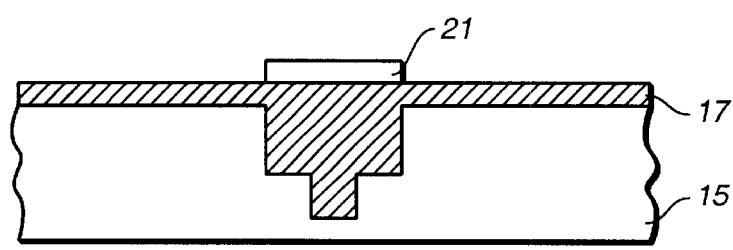
FIG. 11 is a cross-sectional view showing cured photoresist over the dual-damascene feature after photoresist patterning, for another embodiment of the invention.
Figure 12:
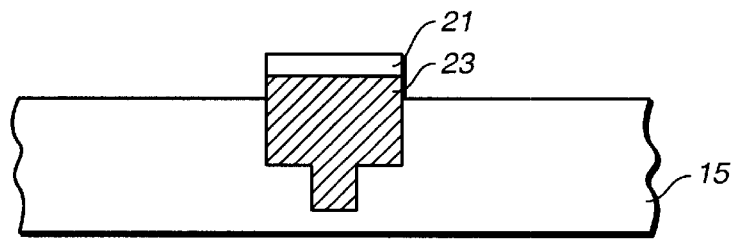
FIG. 12 is a cross-sectional view showing that, after etching the interconnect material, the interconnect has excess interconnect material, that is, interconnect material above the plane of the substrate, for another embodiment of the invention.
Figure 13:
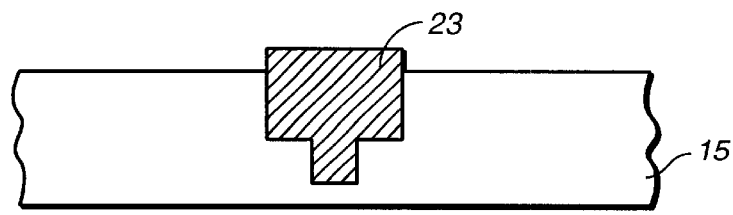
FIG. 13 is a cross-sectional view of the above after photoresist removal for another embodiment of the invention.
Figure 14:
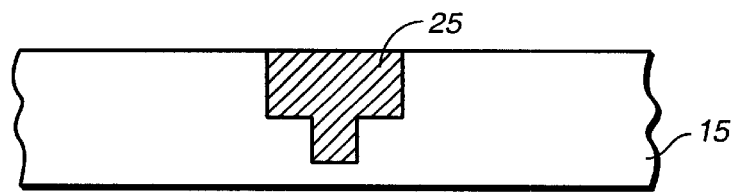
FIG. 14 is a cross-sectional view after planarization, showing an interconnect with minimized dishing, for another embodiment of the invention.

Referring again to the drawing, FIG. 8 shows a cross-sectional view of a substrate 15 with a dual-damascene feature 16, in this case a trench. FIG. 9 shows the trench 16 and top surface of the substrate 15 after interconnect material 17 deposition. FIG. 10 shows a layer of photoresist 19 after deposition. FIG. 11 shows cured photoresist 21 over the dual-damascene feature 16 after photoresist 19 patterning. FIG. 12 shows that, after etching the interconnect material 17, the interconnect 23 has excess interconnect material, that is, interconnect material above the plane of the substrate. FIG. 13 shows the above after photoresist removal. Note that this step is optional as photoresist can also be removed by the next step of planarization. FIG. 14 shows that after planarization, an interconnect 25 with minimized dishing is provided.

Although the invention has been described with reference to illustrative embodiments, it is not limited to those embodiments. Rather, the appended claims should be construed to include other variants and embodiments of the invention that may be made by those skilled in the art without departing from the true spirit and scope of the present invention.

What is claimed is:

1. A method for reducing dishing of an integrated circuit interconnect, comprising the steps of:
   depositing an electrically conductive interconnect material onto a substrate comprised of a substrate material, and wherein the substrate comprises a damascene feature;
   planarizing the interconnect material and substrate until an interconnect exhibits dishing;
   depositing and curing photoresist;
   planarizing to provide cured resist in the interconnect dish;
   partially etching the substrate, wherein the etching is selective for the substrate material; and
   planarizing the interconnect material, photoresist and substrate.

2. The method of claim 1, wherein the substrate material is more abrasion resistant than the interconnect material.

3. The method of claim 1, wherein at least one planarizing step is chemical mechanical polishing.

4. The method of claim 1, further comprising removing the photoresist prior to the final planarization step.

5. The method of claim 1, further comprising the step of depositing a hard mask prior to depositing the photoresist.

6. The method of claim 1, wherein the substrate material comprises silicon.

7. The method of claim 1, wherein the substrate material comprises silicon dioxide.

8. The method of claim 1, wherein the interconnect material is selected from the group consisting of copper and copper alloys.

9. The method of claim 1, comprising the steps of:
   depositing an electrically conductive interconnect material onto a substrate comprised of a substrate material, and wherein the substrate comprises a damascene feature, and wherein the substrate material is more abrasion resistant than the interconnect material, and wherein the interconnect material is selected from the group consisting of copper and copper alloys;
   chemical mechanical polishing the interconnect material and substrate until an interconnect exhibits dishing;
   depositing and curing photoresist;
   chemical-mechanical polishing to provide cured resist in the interconnect dish;
   partially etching the substrate, wherein the etching is selective for the substrate material; and
   chemical mechanical polishing the interconnect material, photoresist and substrate.

10. A method for reducing dishing of an integrated circuit interconnect, comprising the steps of:
    depositing an electrically conductive interconnect material onto a substrate comprised of a substrate material, and wherein the substrate comprises a damascene feature;
    depositing photoresist and patterning the photoresist to provide cured resist over the damascene feature;
    etching the interconnect material, wherein the etching is selective for the interconnect material; and
    planarizing the interconnect material, photoresist and substrate to provide an interconnect in the substrate.

11. The method of claim 10, wherein the substrate material is more abrasion resistant than the interconnect material.

12. The method of claim 10, wherein the planarizing step is chemical mechanical polishing.

13. The method of claim 10, further comprising removing the photoresist prior to the planarization step.

14. The method of claim 10, further comprising the step of depositing a hard mask prior to depositing the photoresist.

15. The method of claim 10, wherein the substrate material comprises silicon.

16. The method of claim 11, wherein the substrate material comprises silicon dioxide.

17. The method of claim 11, wherein the interconnect material is selected from the group consisting of copper and copper alloys.

18. A method for reducing dishing of an integrated circuit interconnect, comprising the steps of:

depositing an electrically conductive interconnect material onto a substrate comprised of a substrate material, and wherein the substrate comprises a damascene feature, and wherein the substrate material is more abrasion resistant than the interconnect material, and wherein the interconnect material is selected from the group consisting of copper and copper alloys;

depositing photoresist and patterning the photoresist to provide cured resist over the damascene feature;

etching the interconnect material, wherein the etching is selective for the interconnect material; and chemical mechanical polishing the interconnect material, photoresist and substrate to provide an interconnect in the substrate.

19. A method for reducing dishing of an integrated circuit interconnect, comprising the steps of;

providing excess interconnect material above a damascene feature in a substrate; and planarizing the substrate and interconnect material to obtain an interconnect in the substrate.

* * * * *